(12) United States Patent
Daubenspeck et al.

(10) Patent No.: US 8,742,594 B2
(45) Date of Patent: Jun. 3, 2014

(54) STRUCTURE AND METHOD OF MAKING AN OFFSET-TRENCH CRACKSTOP THAT FORMS AN AIR GAP ADJACENT TO A PASSIVATED METAL CRACKSTOP

(75) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/615,960

(22) Filed: Sep. 14, 2012

(65) Prior Publication Data

US 2014/0077383 A1  Mar. 20, 2014

(51) Int. Cl.
*H01L 23/48* (2006.01)
*H01L 23/52* (2006.01)
*H01L 29/40* (2006.01)

(52) U.S. Cl.
USPC ............ 257/774; 257/620; 257/758; 257/778

(58) Field of Classification Search
USPC ......................................... 257/774, 620, 778
See application file for complete search history.

(56) References Cited

U.S. PATENT DOCUMENTS

| 5,665,655 | A | 9/1997 | White |
| 5,834,829 | A | 11/1998 | Dinkel et al. |
| 6,495,918 | B1 | 12/2002 | Brintzinger |
| 7,098,676 | B2 | 8/2006 | Landers et al. |
| 7,307,346 | B2 | 12/2007 | Kaltalioglu et al. |
| 7,521,336 | B2 | 4/2009 | Daubenspeck et al. |
| 7,544,602 | B2 | 6/2009 | Clevenger et al. |
| 7,679,200 | B2 | 3/2010 | Su et al. |
| 7,704,804 | B2 | 4/2010 | Daubenspeck et al. |
| 7,790,577 | B2 | 9/2010 | Liu et al. |
| 8,004,066 | B2 | 8/2011 | Kim et al. |
| 2005/0026397 | A1 | 2/2005 | Daubenspeck et al. |
| 2005/0208781 | A1* | 9/2005 | Fitzsimmons et al. ........ 438/800 |
| 2006/0278957 | A1* | 12/2006 | Lin et al. ...................... 257/620 |
| 2008/0237868 | A1* | 10/2008 | Clevenger et al. ............ 257/758 |

(Continued)

OTHER PUBLICATIONS

Chumakov, et al., "Fracture Toughness Assessment of Patterned Cu-Interconnect Stacks by Dual-Cantilever-Beam (DCB) Technique," IEEE Transactions on Semiconductor Manufacturing, vol. 22, No. 4, Nov. 2009, pp. 592-595.

*Primary Examiner* — Long K Tran
*Assistant Examiner* — Dzung Tran
(74) *Attorney, Agent, or Firm* — Gibb & Riley, LLC; David A. Cain, Esq.

(57) ABSTRACT

A structure and method of making an offset-trench crackstop, which forms an air gap in a passivation layer that is adjacent to a passivated top metal layer of a metal crackstop in an integrated circuit (IC) die. The offset-trench crackstop may expose a portion of a topmost dielectric layer in the crackstop region, not expose a topmost patterned metal layer of the metal crackstop, and may be interposed between the metal crackstop and an active device region. Alternatively, the offset-trench crackstop may expose a portion of the topmost dielectric layer, which separates an outermost metal layer and an innermost metal layer of the metal crackstop, and does not expose any of the topmost patterned metal layer of the metal crackstop, where the innermost metal layer of the metal crackstop is interposed between the offset-trench crackstop in the crackstop region and the active device region of the IC die.

15 Claims, 6 Drawing Sheets

(56) References Cited

U.S. PATENT DOCUMENTS

| | | | |
|---|---|---|---|
| 2008/0277765 A1* | 11/2008 | Lane et al. | 257/622 |
| 2009/0065952 A1* | 3/2009 | Su et al. | 257/778 |
| 2009/0203192 A1* | 8/2009 | Kaltalioglu et al. | 438/462 |
| 2010/0187689 A1 | 7/2010 | Kulkarni et al. | |
| 2010/0200960 A1* | 8/2010 | Angyal et al. | 257/620 |
| 2011/0074033 A1 | 3/2011 | Kaltalioglu et al. | |

* cited by examiner

STRUCTURE AND METHOD OF MAKING AN OFFSET-TRENCH CRACKSTOP THAT FORMS AN AIR GAP ADJACENT TO A PASSIVATED METAL CRACKSTOP

BACKGROUND

1. Field of the Invention

This disclosure generally relates to structures and methods of making an offset-trench crackstop that forms an air gap in an opening of a passivation layer which overlies and is adjacent to a passivated top metal layer of a metal crackstop in an integrated circuit (IC) die.

2. Description of Related Art

In manufacturing semiconductor devices, a number of integrated circuits (ICs) are simultaneously prepared on a semiconductor wafer by conventional photolithography techniques. The ICs, which are rectangular in shape, are disposed in a grid pattern on the semiconductor wafer. Each of the four sides of each individual IC is adjacent to a dicing channel. The individual ICs are singulated by dicing the wafer along the dicing channels with either a saw or laser to form IC dies or chips.

Figure 1:
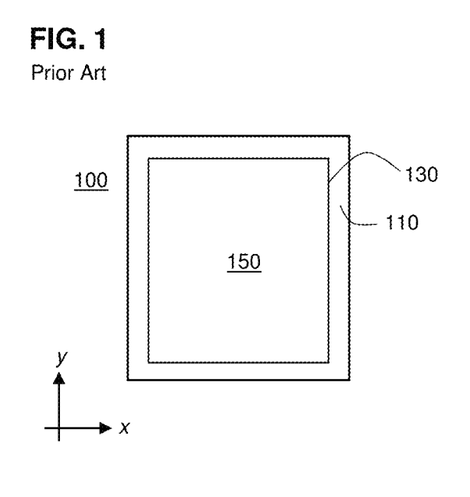
FIG. 1 is a schematic diagram illustrating a top view of an IC die with an active electrical device region, a metal crackstop, and a peripheral boundary region in the related art.

Referring to FIG. 1, an individual IC die or chip 100 includes an active device region 150 that comprises active and passive electrical devices, which provide the IC's functionality, and a peripheral boundary region 110 that is adjacent to the dicing lanes (not shown) in a wafer. The active and passive electrical devices are formed within the semiconductor layers of the active device region 150, which is located behind a metal crackstop 130 that separates the active device region 150 from the peripheral boundary region 110. The IC die 100, including both the active device region 150 and the peripheral boundary region 110, is covered by a plurality of metallization layers. Each of the metallization layers includes a patterned intermetallic dielectric layer that includes vias or via bars and a patterned metal layer, usually comprising aluminum (Al). Within the active device region 150, each of the patterned metal layers includes electrical interconnections to the active and passive electrical devices of the IC die 100 that are contacted by the vias.

Figure 2:
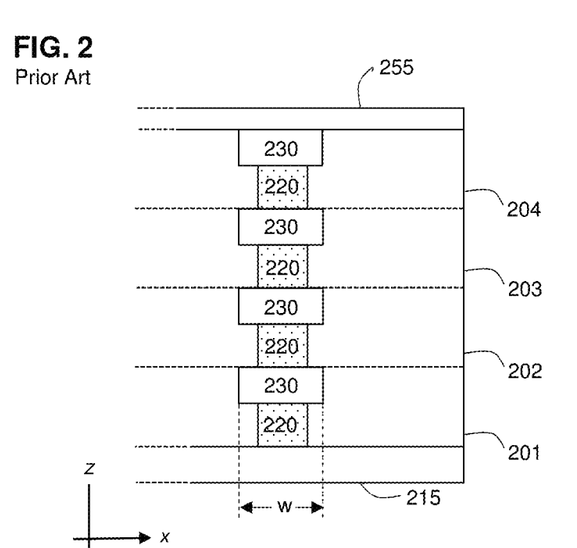
FIG. 2 is a schematic diagram illustrating a cross section of an IC die including a plurality of alternating patterned metal layers and metal via bars that form a metal crackstop in the related art.

Upon dicing, the IC die or chip is subject to crack ingress forces along its sides and at the corners. Conventionally, a metal crackstop is formed parallel to the rectangular perimeter of the IC die to prevent the crack ingress forces from delaminating or cracking the electrical devices and the metallization layers of the active device region. Referring to FIG. 2, a cross section of a four layer 201-204 metal crackstop, along the axes of its sides, includes a plurality of alternating patterned metal layers 230 and metal via bars 220 formed on the silicon layer 215 of the perimeter boundary region, each layer being formed by processes identical to those used in forming the patterned metal layers and vias of the metallization layers in the active device region of the IC die. A passivation layer 255 is formed on the topmost metallization layer that covers the top metal layer 230 of the metal crackstop. Typically, the passivation layer 255 comprises any of a silicon nitride (SiN) layer and a silicon oxide (SiO$_2$) layer.

Figure 3:
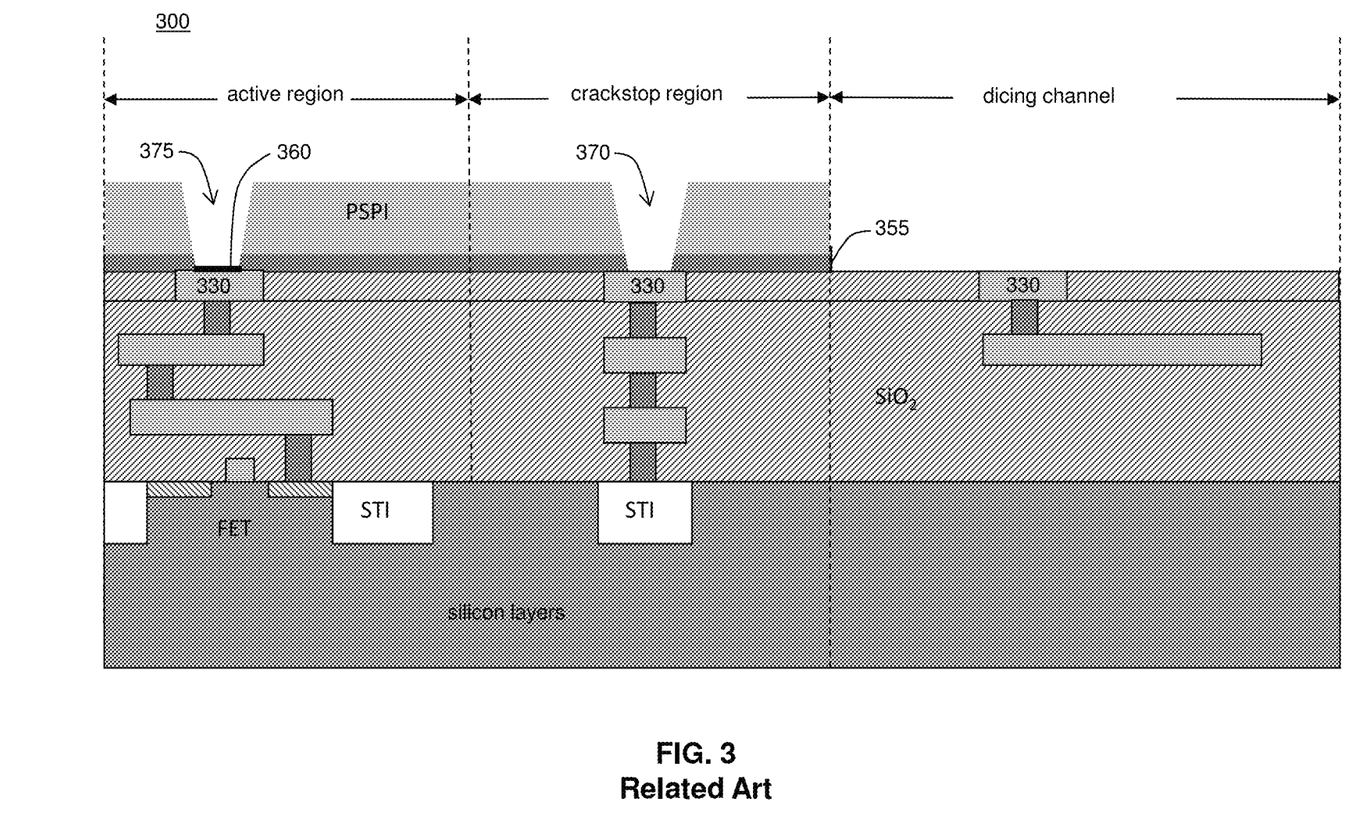
FIG. 3 is a schematic diagram illustrating a cross section of an IC die including an offset-trench crackstop that forms an air gap, over a metal crackstop in the related art.

Referring to FIG. 3, a cross section of a dicing channel region, crackstop region and active device region of an IC die 300 illustrates a conventional crackstop 370, which forms an air gap, and a via hole 375 that are formed in a passivation layer 355 of an IC die 300. As is known in the art, the conventional crackstop 370, which forms an air gap over the metal via bars and patterned metal layers of the metal crackstop in the crackstop region, prevents inward propagation of cracks from the adjacent dicing channel through the passivation layer 335 into the active device region of the IC die 300; whereas formation of via hole 375 in the passivation layer 335 facilitates the subsequent formation of bonding pads 360 and electrical connectors used in flip chip packaging.

Recently, a copper (Cu) pillar process has been introduced into the processes of flip chip packaging. In the Cu pillar process, a Cu seed layer is deposited on exposed portions of a top metal layer 330 of the IC die 300 through via hole 375 to form bonding pads 360 for a Cu pillar or bump. However, when a conventional crackstop 370, which forms an air gap over the top metal layer 330 of the metal crackstop in the passivation layer 335, Cu is also deposited on the top metal layer 330 of the metal crackstop in the Cu pillar process. A wet etch used to remove the Cu from the top metal layer 330 of the metal crackstop is problematic, because it also attacks aluminum (Al) in the top metal layer 330, resulting in visual defects that prevent inspection of the packaging process.

In an additional flip chip packaging process, the physical layout of electrically conductive redistribution layers overlying the IC die would be less constrained, if the redistribution layers were placed over the metal crackstop. Such less constrained layouts, however, cannot be implemented because the redistribution layers would short-out to the underlying metal crackstop.

There remains a need to prevent inward propagation of cracks by an improved crackstop that forms an air gap in a passivation layer on a crackstop region of an integrated circuit (IC) die, while allowing copper (Cu) deposition through a via hole on exposed portions of a top metal layer in an active device region of the IC die.

SUMMARY OF INVENTION

In view of the foregoing, an exemplary embodiment of the disclosure may provide an integrated circuit (IC) die that includes, a metal crackstop comprising a plurality of alternating patterned metal layers and metal via bars that extend continuously from a topmost silicon (Si) layer to a topmost patterned metal layer in a peripheral crackstop region of the IC die. The IC die may also include, a passivation layer formed on the topmost patterned metal layer of the metal crackstop and portions of a topmost dielectric layer in the peripheral crackstop region. The IC die may further include an offset-trench crackstop, which forms an air gap in the passivation layer of the peripheral crackstop region, that exposes a portion of the topmost dielectric layer in the peripheral crackstop region, does not expose any of the topmost patterned metal layer of the metal crackstop, and is interposed between the metal crackstop of the crackstop region and a central active device region of the IC die.

Another exemplary embodiment of the disclosure may provide an integrated circuit (IC) die that includes, a metal crackstop comprising a plurality of alternating patterned metal layers and metal via bars that extend continuously from a topmost silicon (Si) layer to a topmost patterned metal layer in a peripheral crackstop region of the IC die, where the topmost patterned metal layer of the metal crackstop includes an outermost metal layer and an innermost metal layer separated by a topmost dielectric layer. The IC die may also include, a passivation layer formed on the outermost metal layer and the innermost metal layer of the metal crackstop and portions of the topmost dielectric layer in the peripheral crackstop region. The IC die may further include an offset-trench crackstop, which forms an air gap in the passivation layer of the peripheral crackstop region, that exposes a portion of the topmost dielectric layer in the peripheral crackstop region, which separates the outermost metal layer and the innermost metal layer of the topmost patterned metal layer, and does not expose any of the topmost patterned metal layer of the metal crackstop, where the innermost metal layer of the metal crackstop is interposed between the offset-trench crackstop that forms an air gap in the peripheral crackstop region and a central active device region of the IC die.

Yet another exemplary embodiment of the disclosure may provide a method of making an integrated circuit (IC) die that includes, forming a metal crackstop comprising a plurality of alternating patterned metal layers and metal via bars that extend continuously from a topmost silicon (Si) layer to a topmost patterned metal layer in a peripheral crackstop region of the IC die. The method may also include, forming a passivation layer on the topmost patterned metal layer and a topmost dielectric layer of the peripheral crackstop region and a central active device region of the IC die. The method may further include, forming an offset-trench crackstop, which forms an air gap in the passivation layer of the peripheral crackstop region, that exposes a portion of the topmost dielectric layer in the peripheral crackstop region, does not expose any of the topmost patterned metal layer of the metal crackstop, and is interposed between the metal crackstop of the peripheral crackstop region and the central active device region.

Yet another exemplary embodiment of the disclosure may provide a method of making an integrated circuit (IC) die that includes, forming a metal crackstop comprising a plurality of alternating patterned metal layers and metal via bars that extend continuously from a topmost silicon (Si) layer of the IC die to a topmost patterned metal layer in a peripheral crackstop region of the IC die, where the topmost patterned metal layer in the peripheral crackstop region includes an outermost metal layer and an innermost metal layer separated by a topmost dielectric layer. The method may also include, forming a passivation layer on the topmost patterned metal layer and the topmost dielectric layer of the peripheral crackstop region and a central active device region of the IC die. The method may further include, forming an offset-trench crackstop, which forms an air gap in the passivation layer of the peripheral crackstop region, that exposes a portion of the topmost dielectric layer in the peripheral crackstop region, which separates the outermost metal layer and the innermost metal layer of the metal crackstop, and does not expose any of the topmost patterned metal layer of the metal crackstop, where the innermost metal layer of the metal crackstop is interposed between the offset-trench crackstop that forms an air gap in the peripheral crackstop region and the central active device region of the IC die.

BRIEF DESCRIPTION OF THE DRAWINGS

The exemplary embodiments of the disclosures herein will be better understood from the following detailed description with reference to the drawings, which are not necessarily drawn to scale and in which.

DETAILED DESCRIPTION

The exemplary embodiments of the disclosure and their various features and advantageous details are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the disclosure. The examples used herein are intended to merely facilitate an understanding of ways in which the exemplary embodiments of the disclosure may be practiced and to further enable those of skill in the art to practice the exemplary embodiments of the disclosure. Accordingly, the examples should not be construed as limiting the scope of the exemplary embodiments of the disclosure.

As described above, there remains a need to prevent inward propagation of cracks by an offset-trench crackstop that forms an air gap in a passivation layer on a crackstop region of an integrated circuit (IC) die, while allowing copper (Cu) deposition through a via hole on exposed portions of a top metal layer in an active device region of the IC die.

Figure 4:
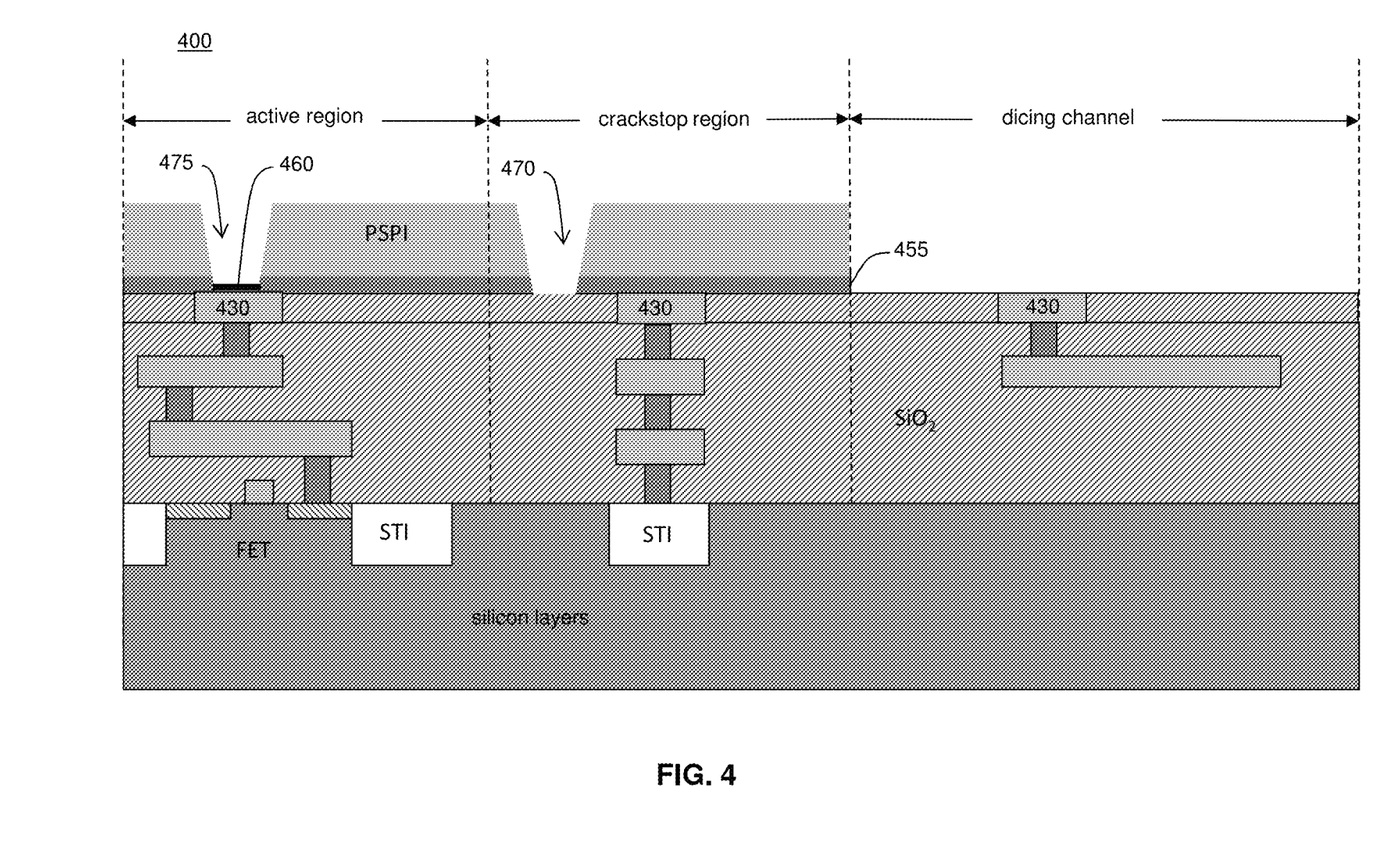
FIG. 4 is a schematic diagram illustrating a cross section of an IC die including an offset-trench crackstop that forms an air gap above and adjacent to an underlying passivated metal crackstop in an exemplary embodiment.

Referring to FIG. 4, a cross section of an integrated circuit (IC) die 400 illustrates an offset-trench crackstop 470 that forms an air gap in a passivation layer 455, which covers a topmost patterned metal layer 430 of a metal crackstop in a peripheral crackstop region of the IC die 400. The metal crackstop may comprise a plurality of alternating patterned metal layers and metal via bars that extend upward from a topmost silicon (Si) layer of the IC die 400 to a topmost patterned metal layer 430 of the metal crackstop in the peripheral crackstop region, to form a metal wall, which may prevent ingress of cracking forces to a central active device region of the IC die 400. The plurality of alternating patterned metal layers and metal via bars, including the topmost patterned metal layer 430 of the metal crackstop, may comprise aluminum (Al).

In the peripheral crackstop region of the IC die 400, a passivation layer 455 may be formed on the topmost patterned metal layer 430 of the metal crackstop and portions of a topmost dielectric layer, for example, a silicon dioxide ($SiO_2$) layer. The passivation layer 455 may also extend over portions of the topmost dielectric layer of the central active device region of the IC die 400, while not covering those portions of the topmost patterned metal layer 430, which are exposed by via holes 475 within the central active device region. The passivation layer 455 may comprise any of silicon nitride (SiN) and $SiO_2$.

An air-gap crackstop 470, which forms an air gap in the passivation layer 455 of the peripheral crackstop region of the IC die 400, exposes a portion of the topmost dielectric layer, while not exposing any of the topmost patterned metal layer 430 of the metal crackstop. The air-gap crackstop 470 may be interposed between the metal crackstop of the crackstop region and the central active device region of the IC die 400.

A via hole 475 may be formed in the passivation layer 455 of the central active device region of the IC die 400 to allow subsequent forming of a bonding pad 460 on a portion of the topmost metal layer 430 disposed within the central active device region.

A photosensitive polyimide (PSPI) layer may be formed on the passivation layer 455 covering the topmost metal layer 430 and topmost dielectric layer of both the peripheral crackstop region and the central active device region of the IC die 400, before forming the offset-trench crackstop 470, which forms an air gap, and the via hole 475. In this case, forming the offset-trench crackstop 470 and the via hole 475, respectively, in the passivation layer 455 may also require etching, i.e., a final via etch, of the overlying PSPI layer.

Figure 5:
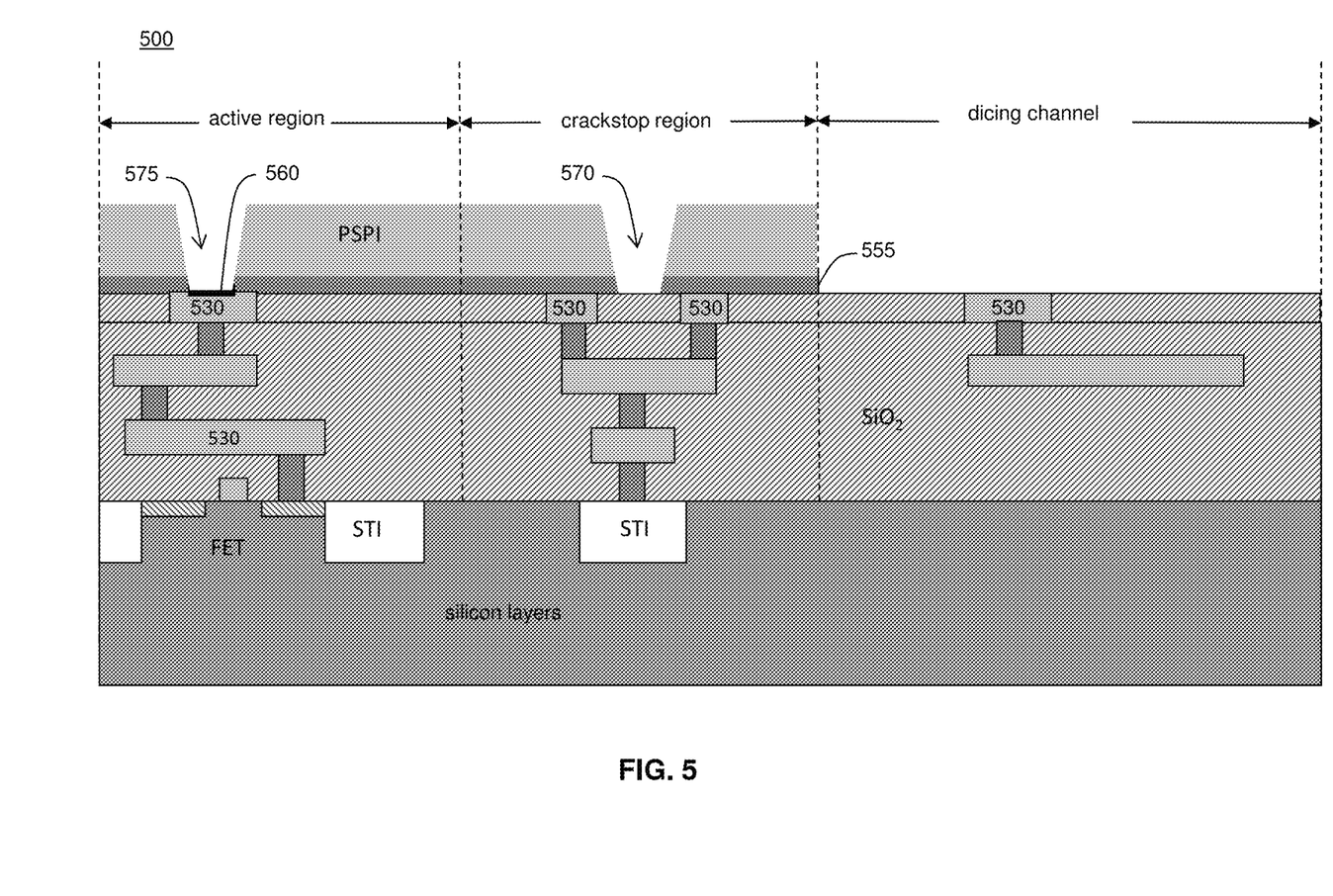
FIG. 5 is a schematic diagram illustrating a cross section of an IC die including an offset-trench crackstop that forms an air gap above and between two underlying passivated portions of a metal crackstop in an exemplary embodiment.

Referring to FIG. 5, a cross section of an integrated circuit (IC) die 500 illustrates an offset-trench crackstop 570 that forms an air gap in a passivation layer 555, which covers portions of a topmost patterned metal layer 530 of a metal crackstop in a peripheral crackstop region of the IC die 500. In the peripheral crackstop region, the topmost patterned metal layer 530 may include an outermost metal layer and an innermost metal layer that are separated by a portion of a topmost dielectric layer. The outermost metal layer and the innermost metal layer may contact, respectively, an underlying outermost metal via bar and an underlying innermost metal via bar that are separated by a dielectric layer. The underlying outermost metal via bar and the underlying innermost metal via bar may, in turn, each contact a single underlying patterned metal layer of the metal crackstop in the crackstop region. Thus, the metal crackstop may comprise a plurality of alternating patterned metal layers and metal via bars that extend upward, as a single metal wall, from a topmost silicon (Si) layer of the IC die 500 to the single underlying patterned metal layer in the crackstop region; after which, the outermost metal layer of the topmost patterned metal and the underlying outermost metal via bar layer, and the innermost metal layer of the topmost patterned metal and the underlying innermost metal via bar may form, respectively, two metal walls that extend up to the covering passivation layer 555. The plurality of alternating patterned metal layers and metal via bars, including the outermost metal layer and the innermost metal layer of the topmost patterned metal layer 530 of the metal crackstop, may comprise aluminum (Al).

In the peripheral crackstop region of the IC die 500, a passivation layer 555 may be formed on the outermost metal layer and the innermost metal layer of the topmost patterned metal layer 530 of the metal crackstop and portions of a topmost dielectric layer, for example, a silicon dioxide ($SiO_2$) layer. The passivation layer 555 may also extend over portions of the topmost dielectric layer of the central active device region of the IC die 500, while not covering those portions of the topmost patterned metal layer 530, which are exposed by via holes 575 within the central active device region. The passivation layer 555 may comprise any of silicon nitride (SiN) and Si.

An offset-trench crackstop 570, which forms an air gap in the passivation layer 555 of the peripheral crackstop region of the IC die 500, exposes a portion of the topmost dielectric layer, which separates the outermost metal layer and the innermost metal layer of the topmost patterned metal layer 530, while not exposing any of the topmost patterned metal layer 530 of the metal crackstop. Thus, the innermost metal layer of the metal crackstop in the crackstop region may be interposed between the offset-trench crackstop 570 that forms an air gap and the central active device region of the IC die 500.

A via hole 575 may be formed in the passivation layer 555 of the central active device region of the IC die 500 to allow subsequent forming of a bonding pad 560, which is formed on a portion of the topmost metal layer 530 disposed within the central active device region.

A photosensitive polyimide (PSPI) layer may be formed on the passivation layer 555 covering the topmost metal layer 530 and topmost dielectric layer of both the peripheral crackstop region and the central active device region of the IC die 500, before the forming of the offset-trench crackstop 570, which forms an air gap, and the via hole 575. In this case, forming the offset-trench crackstop 570 and the via hole 575, respectively, in the passivation layer 555 may also require etching, i.e., a final via etch, of the overlying PSPI layer.

Figure 6:
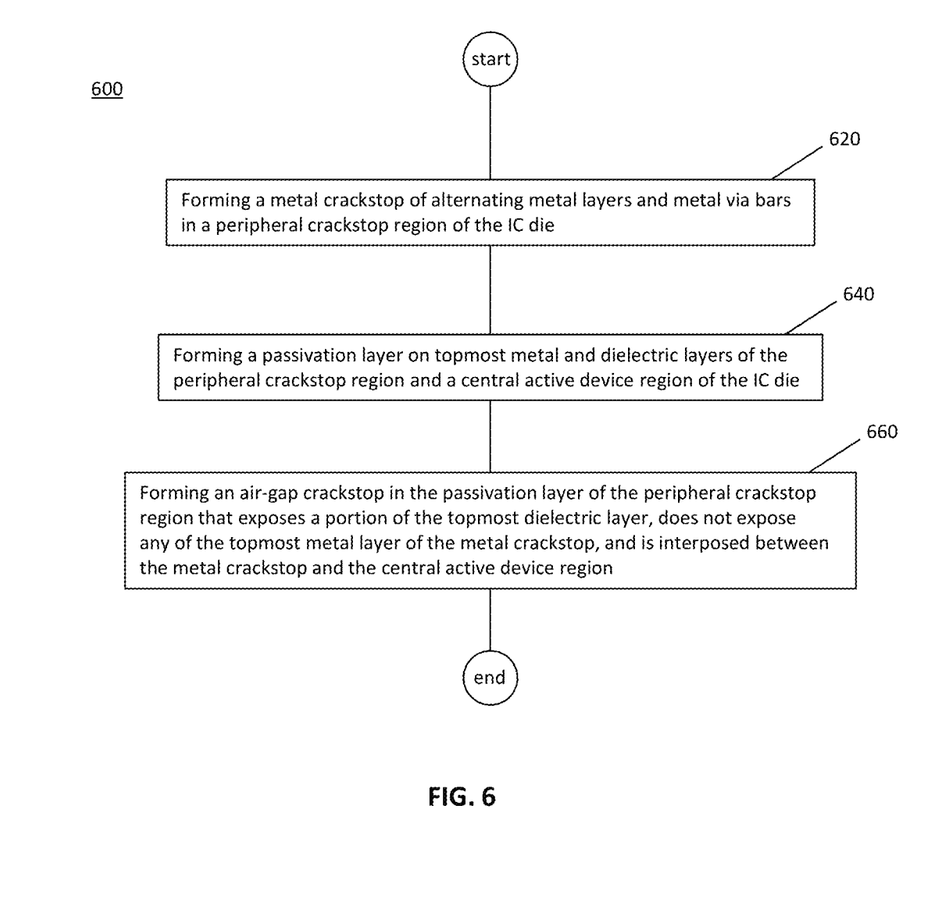
FIG. 6 is a flow chart illustrating a method of making the IC die depicted in FIG. 4, above, in an exemplary embodiment.

Referring to FIG. 6, a flowchart 600 illustrates a method of making an integrated circuit (IC) die that may include forming a metal crackstop that comprises a plurality of alternating patterned metal layers and metal via bars that extend continuously from a topmost silicon (Si) layer to a topmost patterned metal layer in a peripheral crackstop region of the IC die, 620. The plurality of alternating patterned metal layers and metal via bars of the metal crackstop may form a vertical metal wall from the topmost Si layer to the topmost patterned metal layer of the peripheral crackstop region. The method may also include forming a passivation layer on the topmost patterned metal layer and a topmost dielectric layer of the peripheral crackstop region and a central active device region of the IC die, 640. The method may further include forming an offset-trench crackstop, which forms an air gap in the passivation layer of the peripheral crackstop region, that exposes a portion of the topmost dielectric layer in the peripheral crackstop region, does not expose any of the topmost patterned metal layer of the metal crackstop, and is interposed between the metal crackstop of the peripheral crackstop region and the central active device region, 660. The method may yet further include forming a via hole in the passivation layer of the central active device region that exposes a portion of the topmost patterned metal layer in the central active device region, and forming a bonding pad on the topmost patterned metal layer that is exposed.

Figure 7:
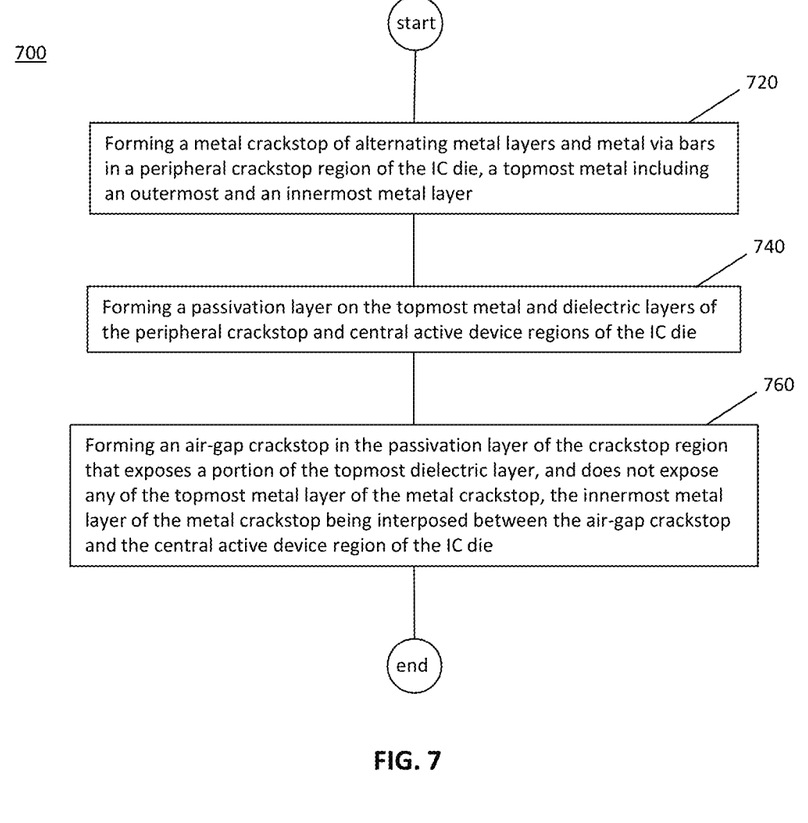
FIG. 7 is a flow chart illustrating a method of making the IC die depicted in FIG. 5, above, in an exemplary embodiment.

Referring to FIG. 7, a flowchart 700 illustrates a method of making an integrated circuit (IC) die that may include forming a metal crackstop that comprises a plurality of alternating patterned metal layers and metal via bars that extend continuously from a topmost silicon (Si) layer of the IC die to a topmost patterned metal layer in a peripheral crackstop region of the IC die, where the topmost patterned metal layer in the peripheral crackstop region includes an outermost metal layer and an innermost metal layer separated by a topmost dielectric layer, 720. The forming of the metal crackstop may further include forming an underlying outermost metal via bar and an underlying innermost metal via bar that contact, respectively, the outermost metal layer and the innermost metal layer of the metal crackstop, where each of the underlying outermost metal via bar and the underlying innermost metal via bar may contact a single underlying patterned metal layer of the metal crackstop. The outermost metal layer and the underlying outermost metal via bar may form an outermost upper metal wall of the metal crackstop, and the innermost metal layer and the underlying innermost metal via bar may form an innermost upper metal wall of the metal crackstop; while the single underlying patterned metal layer may form a topmost layer of a single lower metal wall that extends downward to the topmost Si layer of the IC die in the peripheral crackstop region.

The method may also include forming a passivation layer on the topmost patterned metal layer and a topmost dielectric layer of the peripheral crackstop region and a central active device region of the IC die, 740.

The method may further include forming an offset-trench crackstop, which forms an air gap in the passivation layer of the peripheral crackstop region, that exposes a portion of the topmost dielectric layer in said peripheral crackstop region, which separates the outermost metal layer and the innermost metal layer of the metal crackstop, and does not expose any of the topmost patterned metal layer of the metal crackstop, where the innermost metal layer of the metal crackstop may be interposed between the offset-trench crackstop that forms an air gap in the peripheral crackstop region and the central active device region of the IC die, 760. The method may yet further include forming a via hole in the passivation layer of the central active device region that exposes a portion of the topmost patterned metal layer in the central active device region, and forming a bonding pad on the topmost patterned metal layer that is exposed.

In the packaging, the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) die, comprising:
   a metal crackstop comprising a plurality of alternating patterned metal layers and metal via bars extending continuously from a topmost silicon (Si) layer through a plurality of dielectric layers to a topmost patterned metal layer, which is co-planar with a topmost dielectric layer in a peripheral crackstop region of said IC die;
   a passivation layer on said topmost patterned metal layer of said metal crackstop and portions of said topmost dielectric layer in said peripheral crackstop region and in a central active device region of said IC die;
   an offset-trench crackstop comprising an air gap that extends through said passivation layer to a top surface of said topmost dielectric layer of said peripheral crackstop region, said air gap exposing a portion of said topmost dielectric layer in said peripheral crackstop region, not exposing any of said topmost patterned metal layer of said metal crackstop, and being interposed between said metal crackstop of said crackstop region and said central active device region of said IC die; and
   a via hole, formed in said passivation layer of said central active device region, that exposes a bonding pad on a portion of said topmost patterned metal layer in said central active device region.

2. The IC die of claim 1, said passivation layer also covering portions of said topmost dielectric layer in said central active device region of said IC die.

3. The IC die of claim 1, said plurality of alternating patterned metal layers and metal via bars of said metal crackstop forming a vertical metal wall from said topmost Si layer to said topmost patterned metal layer in said peripheral crackstop region.

4. The IC die of claim 1, each of said plurality of alternating patterned metal layers, including said topmost patterned metal layer, containing aluminum (Al).

5. The IC die of claim 2, said passivation layer comprising any of silicon nitride (SiN) and silicon dioxide ($SiO_2$).

6. An integrated circuit (IC) die, comprising:
   a metal crackstop comprising a plurality of alternating patterned metal layers and metal via bars extending continuously from a topmost silicon (Si) layer through a plurality of dielectric layers to a topmost patterned metal layer, which is co-planar with a topmost dielectric layer in a peripheral crackstop region of said IC die, said topmost patterned metal layer of said metal crackstop including an outermost metal layer and an innermost metal layer separated by a portion of said topmost dielectric layer in said peripheral crackstop region of said IC die;
   a passivation layer on said outermost metal layer and said innermost metal layer of said metal crackstop and portions of said topmost dielectric layer in said peripheral crackstop region and in a central active device region of said IC die;

an offset-trench crackstop comprising an air gap that extends through said passivation layer to a top surface of said topmost dielectric layer of said peripheral crackstop region, said air gap exposing a portion of said topmost dielectric layer, separating said outermost metal layer and said innermost metal layer of said topmost patterned metal layer, in said peripheral crackstop region, and not exposing any of said topmost patterned metal layer of said metal crackstop, said innermost metal layer of said metal crackstop being interposed between said offset-trench crackstop and said central active device region of said IC die; and a via hole, formed in said passivation layer of said central active device region, that exposes a bonding pad on a portion of said topmost patterned metal layer in said central active device region.

7. The IC die of claim 6, said passivation layer also covering portions of said topmost dielectric layer in said central active device region of said IC die.

8. The IC die of claim 6, said outermost metal layer and said innermost metal layer contacting, respectively, an underlying outermost metal via bar and an underlying innermost metal via bar that are separated by a dielectric layer and that each contact a single underlying patterned metal layer of said metal crackstop.

9. The IC die of claim 6, each of said plurality of alternating patterned metal layers, including said outermost metal layer and said innermost metal layer of said topmost patterned metal layer, containing aluminum (Al).

10. The IC die of claim 7, said passivation layer comprising any of silicon nitride (SiN) and silicon dioxide ($SiO_2$).

11. A method of making an integrated circuit (IC) die, said method comprising:

forming a metal crackstop comprising a plurality of alternating patterned metal layers and metal via bars extending continuously from a topmost silicon (Si) layer through a plurality of dielectric layers to a topmost patterned metal layer, which is co-planar with a topmost dielectric layer in a peripheral crackstop region of said IC die;

forming a passivation layer on said topmost patterned metal layer and a topmost dielectric layer of said peripheral crackstop region and a central active device region of said IC die; and forming an offset-trench crackstop comprising an air gap that extends through said passivation layer to a top surface of said topmost dielectric layer of said peripheral crackstop region, said air gap exposing a portion of said topmost dielectric layer in said peripheral crackstop region, not exposing any of said topmost patterned metal layer of said metal crackstop, and being interposed between said metal crackstop of said peripheral crackstop region and said central active device region;

forming a via hole in said passivation layer of said central active device region that exposes a portion of said topmost patterned metal layer in said central active device region; and forming a bonding pad on said topmost patterned metal layer in said central active device region that is exposed.

12. A method of making an integrated circuit (IC) die, said method comprising:

forming a metal crackstop comprising a plurality of alternating patterned metal layers and metal via bars extending continuously from a topmost silicon (Si) layer through a plurality of dielectric layers of said IC die to a topmost patterned metal layer, which is co-planar with a topmost dielectric layer in a peripheral crackstop region of said IC die, said topmost patterned metal layer in said peripheral crackstop region including an outermost metal layer and an innermost metal layer separated by a topmost dielectric layer;

forming a passivation layer on said topmost patterned metal layer and said topmost dielectric layer of said peripheral crackstop region and a central active device region of said IC die; and forming an offset-trench crackstop comprising an air gap that extends through said passivation layer to a top surface of said topmost dielectric layer of said peripheral crackstop region, said air gap exposing a portion of said topmost dielectric layer in said peripheral crackstop region separating said outermost metal layer and said innermost metal layer of said topmost patterned metal layer of said metal crackstop, and not exposing any of said topmost patterned metal layer of said metal crackstop, said innermost metal layer of said metal crackstop being interposed between said offset-trench crackstop that and said central active device region of said IC die;

forming a via hole in said passivation layer of said central active device region that exposes a portion of said topmost patterned metal layer in said central active device region; and forming a bonding pad on said topmost patterned metal layer in said central active device region that is exposed.

13. The method of claim 12, said forming a metal crackstop further comprising forming an underlying outermost metal via bar and an underlying innermost metal via bar that contact, respectively, said outermost metal layer and said innermost metal layer of said metal crackstop, each of said underlying outermost metal via bar and said underlying innermost metal via bar contacting a single underlying patterned metal layer of said metal crackstop.

14. The method of claim 13, said outermost metal layer and said underlying outermost metal via bar forming an outermost upper metal wall of said metal crackstop, and said innermost metal layer and said underlying innermost metal via bar forming an innermost upper metal wall of said metal crackstop.

15. The method of claim 13, said single underlying patterned metal layer forming a topmost layer of a single lower metal wall extending downward to said topmost Si layer of said IC die in said peripheral crackstop region.

* * * * *